(12) United States Patent
Molina, Jr. et al.

(10) Patent No.: US 8,321,826 B2
(45) Date of Patent: Nov. 27, 2012

(54) METHOD AND APPARATUS OF CORE TIMING PREDICTION OF CORE LOGIC IN THE CHIP-LEVEL IMPLEMENTATION PROCESS THROUGH AN OVER-CORE WINDOW ON A CHIP-LEVEL ROUTING LAYER

(75) Inventors: Ruben Salvador Molina, Jr., San Ramon, CA (US); Alexander Tetelbaum, Hayward, CA (US)

(73) Assignee: LSI Corporation, Milpitas, CA (US)

( * ) Notice: Subject to any disclaimer, the term of this patent is extended or adjusted under 35 U.S.C. 154(b) by 218 days.

(21) Appl. No.: 12/791,260

(22) Filed: Jun. 1, 2010

(65) Prior Publication Data

US 2010/0289112 A1 Nov. 18, 2010

Related U.S. Application Data

(62) Division of application No. 11/413,236, filed on Apr. 28, 2006, now Pat. No. 7,739,639.

(51) Int. Cl.
*G06F 17/50* (2006.01)
*G06F 9/455* (2006.01)

(52) U.S. Cl. ........................ 716/113; 716/108; 716/115

(58) Field of Classification Search .................. 716/113, 716/115, 120, 121, 122, 126, 127, 128, 134; 257/499; 326/38–41, 47, 101–103
See application file for complete search history.

(56) References Cited

U.S. PATENT DOCUMENTS 6,978,433 B1 * 12/2005 Gan et al. ...................... 716/120
2007/0079265 A1 * 4/2007 Hill et al. ........................ 716/5

* cited by examiner

*Primary Examiner* — Vuthe Siek
(74) *Attorney, Agent, or Firm* — Raj Abhyanker, P.C.

(57) ABSTRACT

A method and/or an apparatus of core timing prediction is disclosed. In one embodiment, a method may include generating a core timing model of a core logic that is accurately transferable to any chip-level integration process. The method may reduce performance degradation and/or performance variation of the core logic caused by a number of interactions between core logic components and chip-level components in the chip-level integration process. In addition, the core timing model of the core logic may be generated by filling un-wired tracks with metal in any of an outermost layer of the core logic after a core logic routing and constructing a layer at least an area of and adjacent to any of the outermost layer of the core logic with grounded metal that is orthogonal to those of the metal used in the outermost layer of the core logic.

18 Claims, 11 Drawing Sheets

GENERATE CORE TIMING
MODEL (CTM)

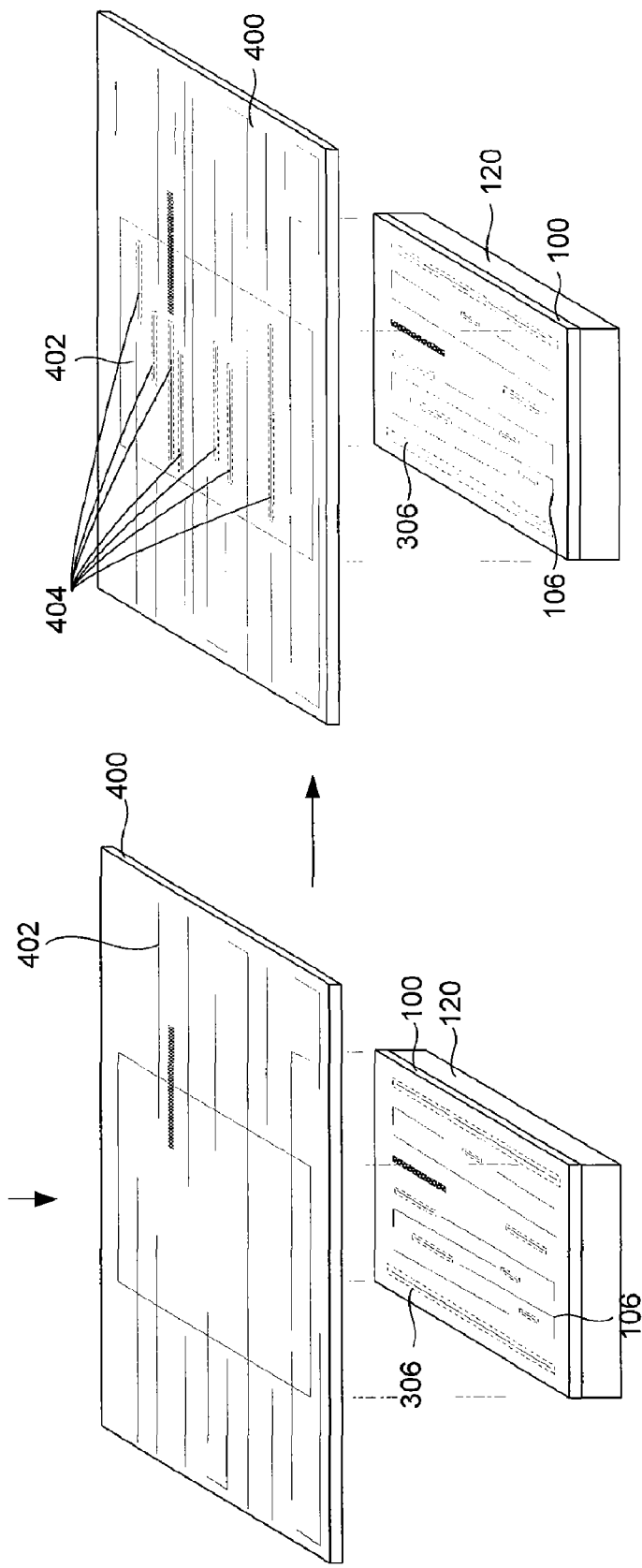

METHOD AND APPARATUS OF CORE TIMING PREDICTION OF CORE LOGIC IN THE CHIP-LEVEL IMPLEMENTATION PROCESS THROUGH AN OVER-CORE WINDOW ON A CHIP-LEVEL ROUTING LAYER

CLAIM OF PRIORITY

This is a divisional application and claims priority from U.S. Utility application Ser. No. 11/413,236 titled "METHOD AND APPARATUS OF CORE TIMING PREDICTION OF CORE LOGIC IN THE CHIP-LEVEL IMPLEMENTATION PROCESS THROUGH AN OVER-CORE WINDOW ON A CHIP-LEVEL ROUTING LAYER" filed on Apr. 28, 2006.

FIELD OF TECHNOLOGY

This disclosure relates generally to the technical fields of electronics, digital circuit technology and electronic design automation and, in one example embodiment, to a method and/or an apparatus of core timing prediction.

BACKGROUND

A core (e.g., a hard core logic module with fixed, fixed gate placement and routing, etc.) may be used in different top level (e.g., chip-level, etc.) design integration processes (e.g., chip level signal routing, power routing, metal utilization, etc.). The core (e.g., the core logic module) level routing (e.g., a signal route, a clock route, a power route, and/or an additional metallization) on a chip may take up a bottommost layers (e.g., a bottom three layers, etc.) of the chip. The top level (e.g., chip-level) routing (e.g., a signal route, a clock route, a power route, and/or an additional metallization) may take up a remaining layers (e.g., top 4-8 layers, etc.).

A core timing model (CTM) of the core may represent path delays from core inputs to core outputs. The core timing model (CTM) of the core is built before a top level integration process (e.g., chip level signal routes, clock routes, power routes, and/or additional metallization, etc.) during which the top level routing is integrated with the core. Hence, parasitic effects (e.g., a cross-talk and a capacitive coupling, etc.) on the core caused by the top level signal routing (e.g., an over-core routing) may not be captured by the core timing model (CTM). By not capturing the parasitic effects in the core timing model, inaccuracies pertaining to a prediction of parasitic effects (e.g., a delay inaccuracy, a timing failure, and/or a corrupt signal, etc.) may be introduced.

As such, a number of procedures may need to be carried out during a core timing model generation process to remedy these inaccuracies. For example, a delay prediction range may need to be increased after the core timing model generation for each design to account for any potential effects (e.g., cross-talk, and capacitive coupling, etc.) due to the top level signal routing (e.g., chip level signal routes, clock routes, power routes, etc.) and/or an additional metallization process during fabrication. In addition, a flat delay prediction and extraction may need to be accomplished at the top level (e.g., extraction that will extract chip and core level signal routes, clock routes, power routes, additional metallization, etc.) before performing timing analysis.

However, the assumption may be a poor representation of the actual top level signal routing situation resulting in more inaccuracies. Transferability of the same core timing model to other applications may also be compromised due to differences in potential effects (e.g., cross-talk, and capacitive coupling, etc.) resulting from different top level (e.g., chip-level) routing. Moreover, these complications may be further aggravated in a design with the over-core routing (e.g., top level routing that may occupy a layer directly above and/or under (e.g., adjacent to) the core level routing during the top level integration process).

In addition, the top level integration process that omits a layer directly adjacent (e.g., directly above and/or directly under) to the outermost layer carrying the core level routing (e.g., chip level signal routes, clock routes, power routes, and/or additional metallization, etc.) places many top-level wires in regions due to avoiding over-core routing. However, by not performing over-core routing during the top level (e.g., chip-level, etc.) integration process (e.g., chip level signal routes, clock routes, power routes, and/or additional metallization, etc.), valuable chip space adjacent to the core may be wasted while aggravating congestion in other regions of the chip. A longer route (e.g., cannot use straight paths, etc.) may be required as a result of avoiding regions adjacent to (e.g., directly above and/or directly below) the core. The longer signal route could potentially drastically decrease performance (e.g., decrease an operating frequency and/or increase interconnect delay, etc.). An additional complication may be introduced in satisfying timing constraints due to reduced flexibility in top level routing (e.g., chip level signal routing, clock routing, power routing, and/or additional metallization, etc.).

SUMMARY

A method and/or an apparatus of core timing prediction is disclosed. In one aspect, a method may include generating a core timing model of a core logic that is accurately transferable to any chip-level integration process and reducing performance degradation and/or performance variation of the core logic caused by interactions between core logic components and chip-level components in the chip level integration process.

In addition, the core timing model of the core logic may be generated by metal filling un-wired tracks in any of an outermost layer of the core logic after a core logic routing and constructing a layer at least an area substantially of and adjacent to any of the outermost layer of the core logic with grounded metal of physical characteristics typical for routing in the layer.

Additionally, a parasitic environment of the core logic caused by the interactions between core logic components and chip-level components preceding a chip-level integration process may be constructed preceding the chip-level integration process and reproduced during the chip-level integration process. The core timing model of the core logic may be generated to represent any over-core routing of any chip-level components preceding the chip-level integration process. A variation range of the core timing model to represent the over-core routing of the chip-level components may be decreased. A cross-talk effect and a capacitive coupling effect may be reduced and a residual effect may be modeled. In addition, a fabrication process variation at the chip-level integration process on the accuracy of the core timing model may be mitigated.

In another aspect, a method to build a core timing model of a core logic may include determining a location of all un-wired tracks in an outermost layer of the core logic after a core logic routing, filling un-wired tracks in the outermost layer of the core logic with metal after the core logic routing, and constructing a layer adjacent to the outermost layer of the core logic with grounded metal orthogonal to a preferred direction of tracks in the outermost layer of the core logic.

In one aspect, a method of a chip-level implementation process includes generating a core timing model of each core logic in a chip and/or filling un-wired tracks of a chip-level routing layer adjacent to the core logic with grounded metal. An over-core chip-level routing of any of the layers used in the chip-level implementation process may be performed. A filled metal in the chip-level routing layer may represent a similar parasitic characteristic to the core logic during a generation of the core timing model. The core timing model may be applied to generate a delay model and/or a cross-talk immune model to any hierarchical structure independent of logic type.

In yet another aspect, a microelectronic assembly includes several layers having microchips forming at least a portion of an integrated circuit die mounted in a package having interconnect ports to operatively connect to another integrated circuit in the microelectronic assembly. Each microchip may include a microchip substrate, at least one core logic layer with an outermost core logic layer having a set of un-wired tracks that are metal filled, and at least one chip level routing layer with an outermost chip-level routing layer adjacent to the outermost core logic layer including another set of un-wired tracks that are metal filled. The metal filling of the core logic and the metal filling of the chip-level routing may be types of metal typically used for routing in these layers. The metal filling of the chip-level routing may spatially occupy approximately an area of the core logic. The microelectronic may include an over-core routing in at least a chip-routing layer.

The methods, systems, and apparatuses disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

Example embodiments are illustrated by way of example and not limitation in the figures of the accompanying drawings, in which like references indicate similar elements and in which:

FIG. 4A-4G are processes involved in generating a core timing model of a core logic and using the core timing model in a chip-level integration process, according to one embodiment.

Figure 1A:
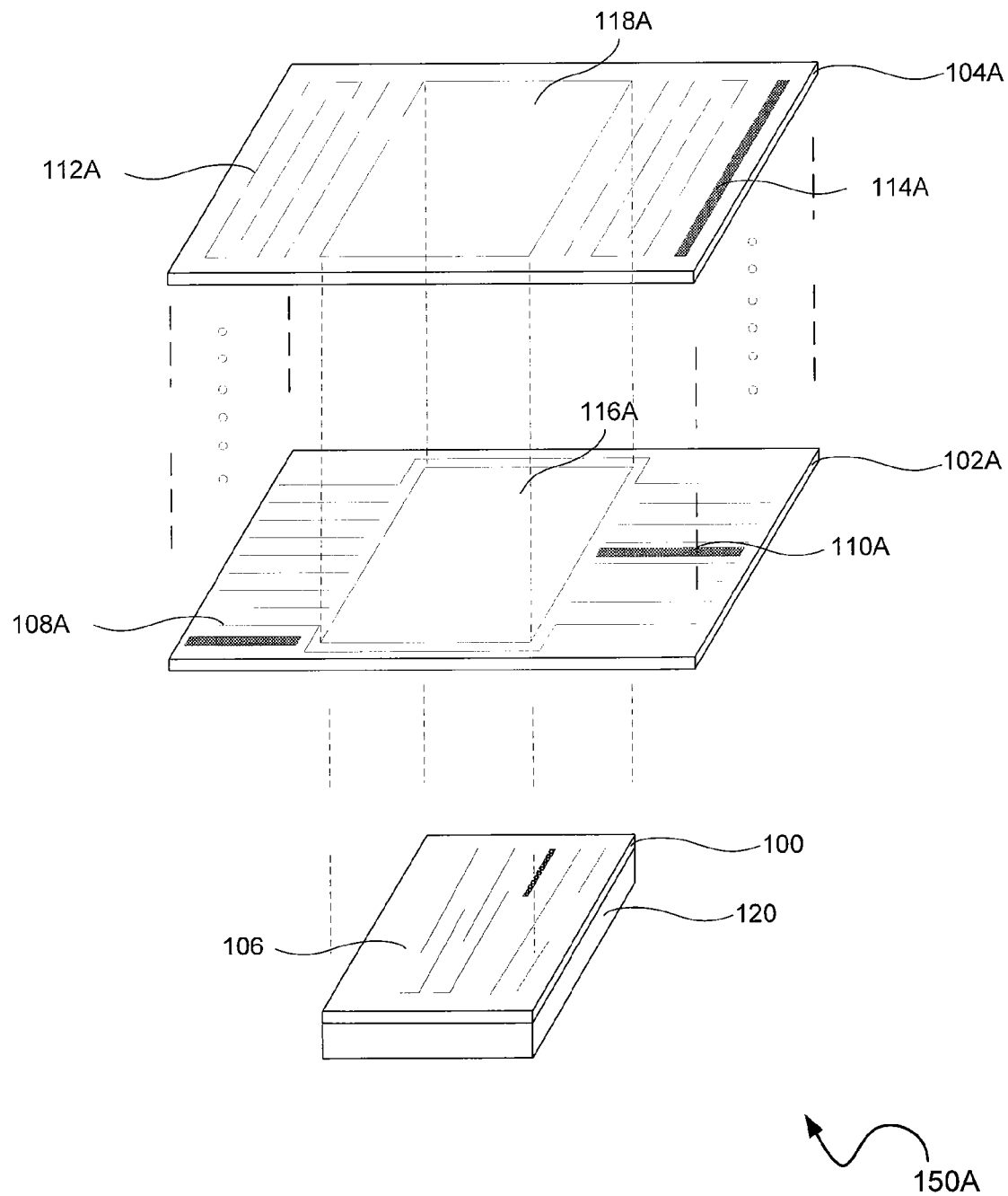
FIG. 1A is an exploded view of a portion of a microchip having a core logic layer and two chip-level routing layers without over-core routing, according to one embodiment.

Other features of the present embodiments will be apparent from the accompanying drawings and from the detailed description that follows.

DETAILED DESCRIPTION

A method and/or an apparatus of core timing prediction is disclosed. In the following description, for the purposes of explanation, numerous specific details are set forth in order to provide a thorough understanding of the various embodiments. It will be evident, however to one skilled in the art that the various embodiments may be practiced without these specific details.

In one embodiment, a method includes generating a core timing model of a core logic (e.g., a core logic 120 of FIG. 1-4) that is accurately transferable to any chip-level integration process (e.g., chip level signal routes, clock routes, power routes, and/or additional metallization, etc.) and reducing any of a performance degradation and performance variation of the core logic caused by interactions between core logic components and chip-level components (e.g., a parasitic capacitor 206, 208, 210, 212, 214 of FIG. 2) in the chip-level integration process (e.g., chip level signal routing, power routing, and/or metal utilization, etc.).

In another embodiment, a method to build a core timing model may include determining a location of un-wired tracks in any of an outermost layer (e.g., a layer 100 of FIGS. 1-4) of the core logic after a core logic routing, filling unwired tracks (e.g., tracks 306 of FIG. 3) in any of the outermost layer of the core logic with metal after the core logic routing (e.g., routing 106 of FIGS. 1-4), and constructing a layer (e.g., a layer 302 of FIG. 3 and FIG. 4C) adjacent to any of the outermost layer (e.g., a layer 100 of FIGS. 1-4) of the core logic with grounded metal (e.g., tracks 308 of FIG. 3) orthogonal to a preferred direction of tracks in the outermost layer of the core logic.

In yet another embodiment, a method of a chip-level implementation process may include generating a core timing model of each core logic (e.g., a core logic 120 of FIGS. 1-4) in a chip and filling un-wired tracks (e.g., tracks 404 of FIG. 4G) of a chip-level routing layer (e.g., a layer 400 of FIG. 4F-G) adjacent to the core logic (e.g., the core logic 120 of FIGS. 1-4) with grounded metal.

FIG. 1A is an exploded view of a portion of a microchip (e.g., a microchip 150A) having core logic (e.g., a core logic 120) with a core logic layer (e.g., a layer 100) and two chip-level routing layers (e.g., a layer 102A, 104A) without over-core routing, according to one embodiment. The core logic layer 100 may have routes (e.g., routes 106), the chip-level routing layer 102A may have routes (e.g., a routing 108A) that are thinner and routes (e.g., a routing 110A) that are thicker, and the chip-level routing layer 104A may have routes (e.g., a routing 112A) that are thinner and routes (e.g. a routing 114A) that is thicker. There may be an over-core window (e.g., an over-core window 116A, 118A) on the chip level routing layer (e.g., the layer 102A, 104A) that is approximately an area of the core logic (e.g., the core logic 120) and approximately located spatially directly above the core logic (e.g., the core logic 120). No routing may take place within the over core window (e.g., the over-core window 116A, 118A) of the chip-level routing layer (e.g., the layer 102A, 104A).

Figure 1B:
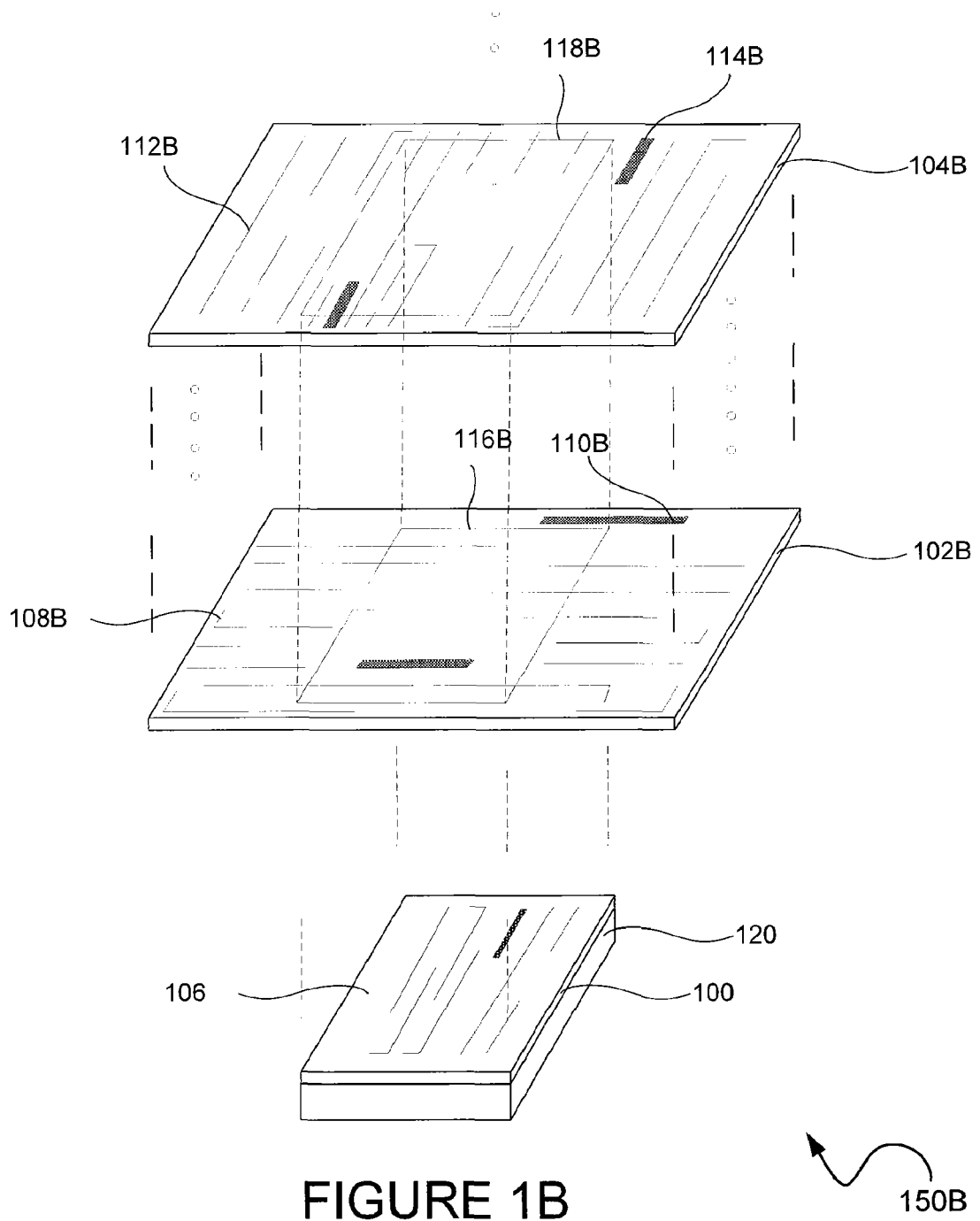
FIG. 1B is an exploded view of a portion of a microchip having a core logic layer and two chip-level routing layers with over-core routing, according to one embodiment.

FIG. 1B is an exploded view of a portion of a microchip (e.g., a microchip 150B) having the core logic (e.g., the core logic 120) with the core logic layer (e.g., the layer 100) and two chip-level routing layers (e.g., a layer 102B, 104B) with over-core routing, according to one embodiment. The core logic layer 100 may have routes (e.g., routes 106), the chip-level routing layer 102B may have routes (e.g., a routing 108B) that are thinner and routes (e.g., a route 110B) that are thicker, and the chip-level routing layer 104B may have routes (e.g., routes 112B) that are thinner and routes (e.g., a route 114B) that are thicker. There may be an over-core window (e.g., an over-core window 116B, 118B) on the chip level routing layer (e.g., the layer 102B, 104B) that is approximately an area of the core logic (e.g., the core logic 120) and approximately located spatially directly above the core logic (e.g., the core logic 120). There may be routing that takes place within the over-core window (e.g., the over-core window 116B, 118B) of the chip-level routing layer (e.g., the layer 102B, 104B).

Figure 2:
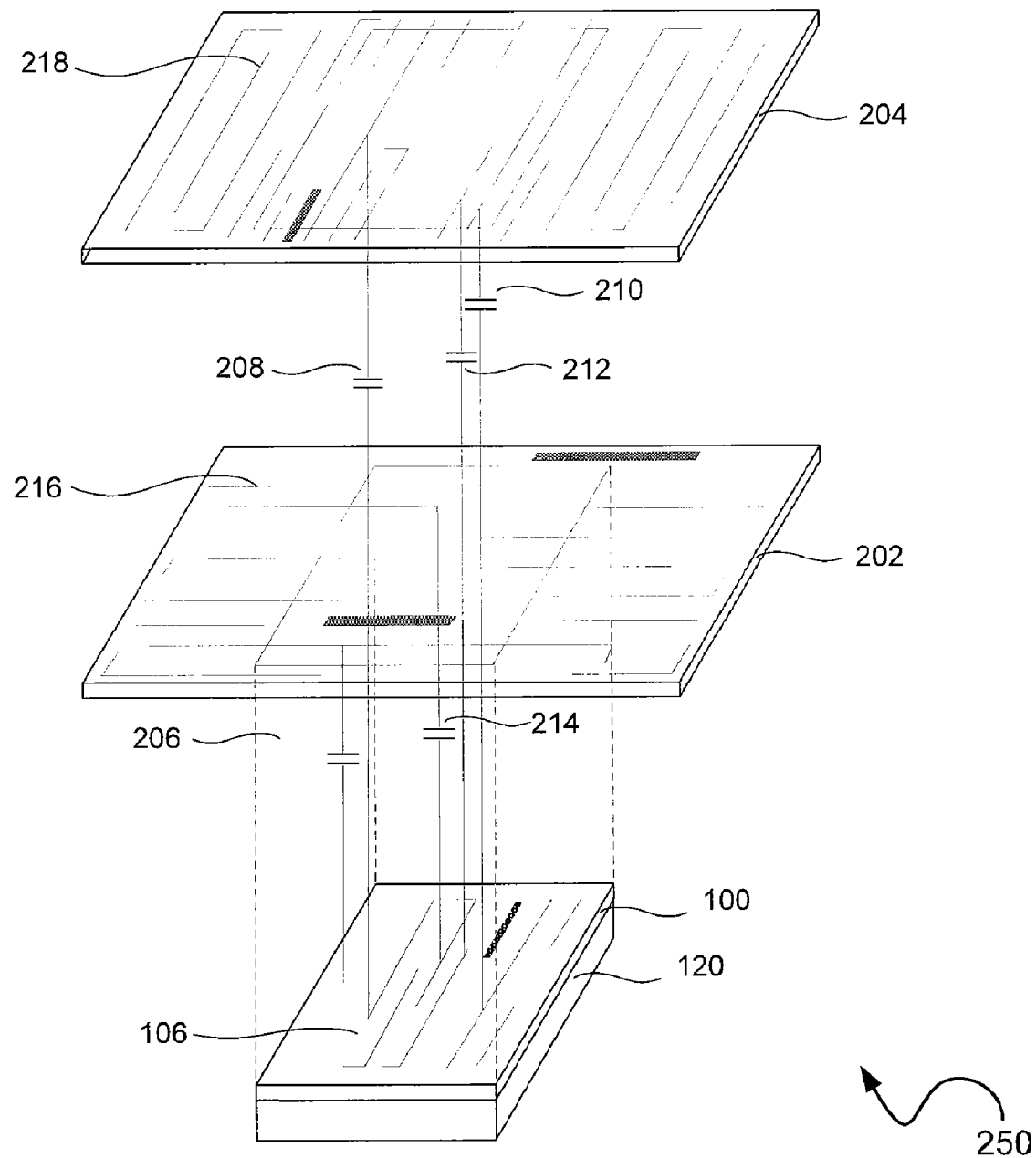
FIG. 2 is an exploded view of a portion of a microchip showing a number of parasitic capacitors due to interactions between a core logic and two chip-level routing layers, according to one embodiment.

FIG. 2 is an exploded view of a portion of a microchip (e.g., a microchip 250) showing a number of parasitic capacitors (e.g., a parasitic capacitor 206, 208, 210, 212, 214) due to interactions between an outermost layer (e.g., a layer 100) of a core logic (e.g., a core logic 120) and two chip-level routing layers (e.g., a layer 202, 204), according to one embodiment. The parasitic capacitors may be due to interactions of a metal between routes (e.g., a set of routes 106) of a core logic layer (e.g., a layer 100), and routes (e.g., a set of routes 216, 218) of the chip-level routing layers (e.g., the layers 202, 204). A capacitor may be formed by two pieces of metal enclosing any region of dielectric media.

Figure 3:
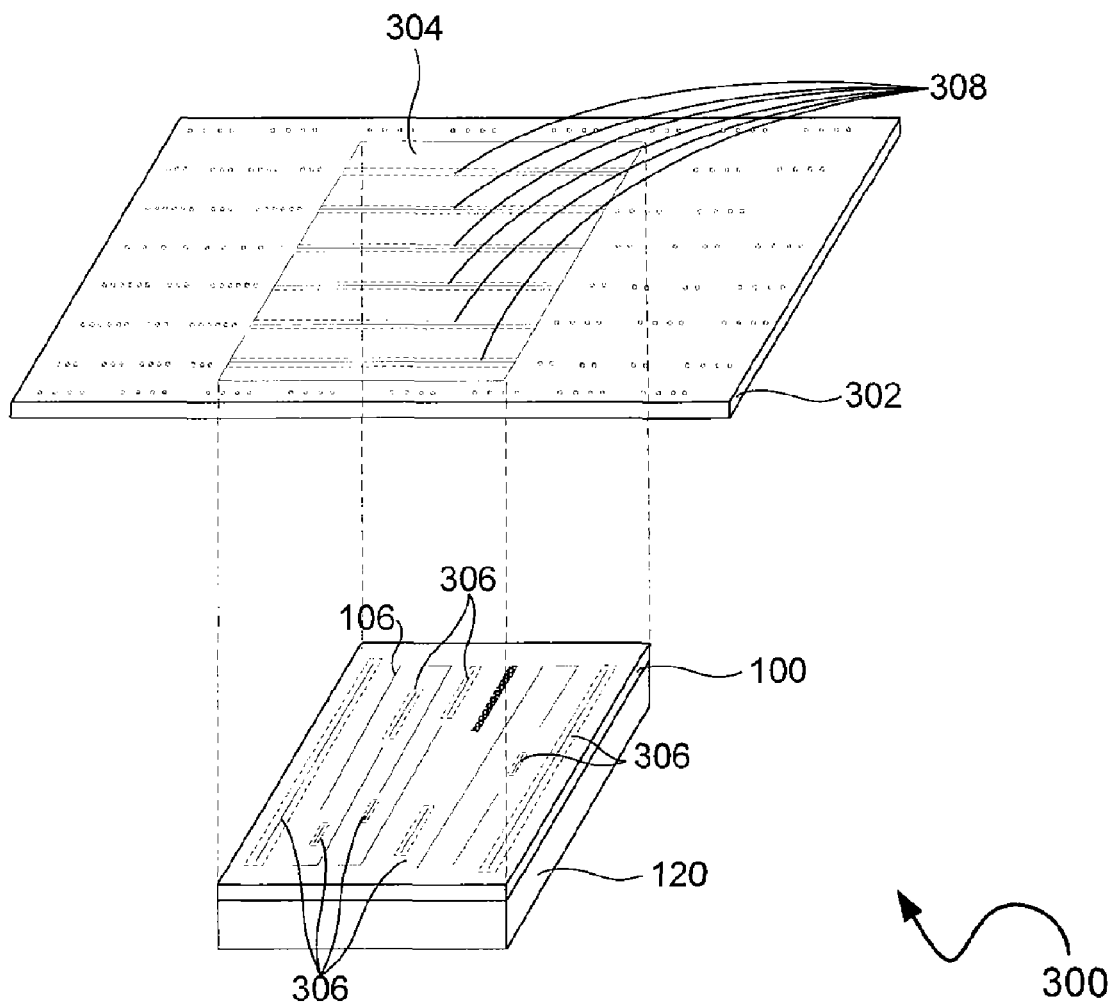
FIG. 3 is an exploded view of a constructed parasitic environment in which a core timing model of a core logic is generated, according to one embodiment.

FIG. 3 is an exploded view of a constructed parasitic environment 300 of a core logic (e.g., a core logic 120) in which a core timing model of a core logic is generated, according to one embodiment.

In FIG. 3, core logic routes (e.g., a set of routes 106) are shown for an outermost layer (e.g., a layer 100). Un-wired tracks (e.g., a set of tracks 306) of the outermost layer 100 may be filled with grounded metal. A layer (e.g., a layer 302) may be constructed adjacent to the outermost layer 100 of the core logic (e.g., the core logic 120) with grounded metal (e.g., the set of fillings 308) orthogonal to a preferred direction of tracks in the outermost layer 100 of the core logic. The grounded metal (e.g., the set of fillings 308) may reside within a core window (e.g., a core window 304) similar to an area of the core logic (e.g., the core logic 120).

A core timing model of the core logic (e.g., the core logic 120) may be generated after metal filling unwired tracks (e.g., the set of tracks 306) in an outermost layer (e.g., the layer 100) of the core logic after a core logic routing and adding the grounded metal (e.g., the set of fillings 308) of the constructed layer (e.g., the layer 302). In this manner, a parasitic environment (e.g., an environment with parasitic capacitors, parasitic resistance, etc.) of the core logic caused by interactions between core logic components and chip-level components (e.g., a parasitic capacitor 206, 208, 210, 212, 214 of FIG. 2) may be constructed preceding any chip-level integration process (e.g., chip level signal routes, clock routes, power routes, additional metallization, etc.).

Figure 4A:
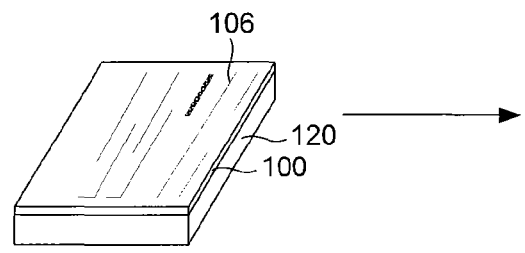

FIG. 4A-4G are processes involved in generating a core timing model of a core logic (e.g., a core logic 120) and using the core timing model in a chip level integration process (e.g., chip level signal routes, clock routes, power routes, adding additional metallization, etc.), according to one embodiment. FIG. 4A is an exploded view of core logic (e.g., the core logic 120). The core logic (e.g., the core logic 120) may have an outermost layer (e.g., a layer 100) with core logic routes (e.g., a set of routes 106).

Figure 4B:
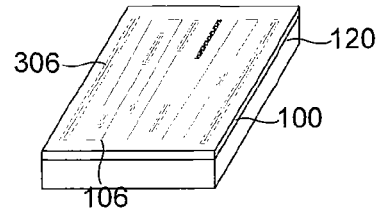

FIG. 4B is an exploded view of the core logic (e.g., the core logic 120) with the set of routes 106. A location of un-wired tracks (e.g., a set of tracks 306) in any outermost layer (e.g., the layer 100) of the core logic (e.g., the core logic 120) may be determined after a core logic routing. A set of un-wired tracks (e.g., the set of tracks 306) of the outermost layer (e.g., the layer 100) of the core logic (e.g., the core logic 120) may be filled with metal to minimize impact of a parasitic environment (e.g., cross-talk and a capacitive coupling, etc.) that may be present after the core logic (e.g., the core logic 120) is used in a chip-level integration process (e.g., chip level signal routes, clock routes, power routes, and/or additional metallization, etc.).

Figure 4D:
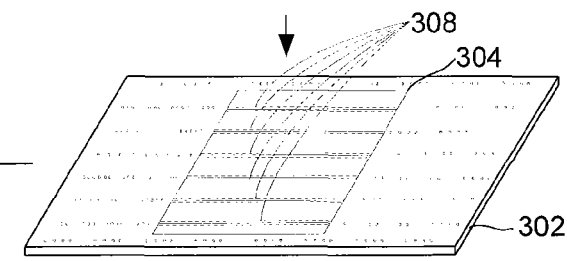
Figure 4E:
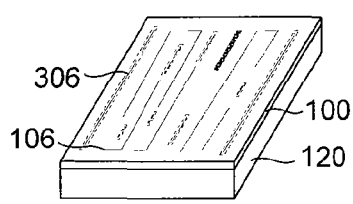
Figure 4C:
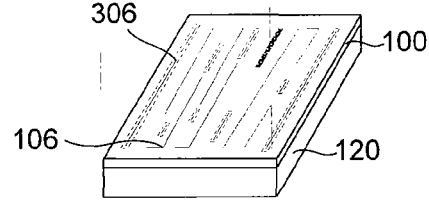

FIG. 4C is a constructed parasitic environment 300 of the core logic (e.g., the core logic 120) in which a core timing model of the core logic is generated, according to one embodiment. In FIG. 4C, the core logic routes (e.g., the set of routes 106) are shown for an outermost layer (e.g., the layer 100). The un-wired tracks (e.g., the set of tracks 306) of the outermost layer 100 may be filled with metal. A layer (e.g., a layer 302) may be constructed adjacent to the outermost layer 100 of the core logic (e.g., the core logic 120) with grounded metal (e.g., the set of tracks 308) orthogonal to a preferred direction of tracks in the outermost layer 100 of the core logic. The grounded metal (e.g., the set of fillings 308) may reside within a core window (e.g., a core window 304) substantially similar to an area of the core logic (e.g., the core logic 120).

In FIG. 4D, the core timing model of the core logic (e.g., the core logic 120) may be generated based on the constructed parasitic environment 300 of FIG. 4C. The core timing model represents core timing and may be used for any over-core routing of any chip-level components. A variation range of the core timing model to represent the over-core routing (e.g., a layer 102B, 104B of FIG. 1B) of any of the chip-level components may be decreased. A cross-talk effect and/or a capacitive coupling effect may also be reduced. Performance degradation due to any of a residual cross-talk effect and/or a capacitive coupling effect may be modeled. A fabrication process variation (e.g., a dielectric thickness variation, a device dimension variation, a metal dimension variation, etc.) on the accuracy of the core timing model may be mitigated.

A delay prediction range may be determined by a static timing analysis tool. In 90 nm. Technology and below, a minimum delay value of the delay prediction range may be decreased by 5% and the maximum delay value of the delay prediction range may be increased by 2% to account for grounding gaps and other non-idealities (e.g., incomplete metal filling, etc.). The core timing model may also be used to generate a delay model and/or a cross-talk immune model of any hierarchical arrangement (e.g., placing a black box in a higher level design, etc.) independent of logic type.

In FIG. 4E, the layer (e.g., the layer 302) may be removed from the constructed parasitic environment 300 of the core logic (e.g., the core logic 120) after the core timing model of the core logic has been generated. The core logic (e.g., the core logic 120) with the outermost layer (e.g., the layer 100) metal filled in the un-wired tracks (e.g., the set of tracks 306) and with the core logic routing (e.g., the set of tracks 106) maybe used in a chip-level integration process (e.g., chip level signal routes, clock routes, power routes, additional metallization, etc.).

FIG. 4F is an exploded view of the core logic (e.g., the core logic 120) utilized in a chip-level integration process (e.g., chip level signal routes, clock routes, power routes, etc.) where chip-level routing is performed in a chip-level routing layer (e.g., the layer 400) adjacent to the outermost core logic layer (e.g., the layer 100). The outermost core logic layer (e.g., the layer 100) may have core logic routes (e.g., the routes 106) and metal filled un-wired tracks (e.g., the set of tracks 306). The chip-level routing layer (e.g., the layer 400) may have a set of routes (e.g., a set of routes 402).

FIG. 4G is an exploded view of the core logic (e.g., the core logic 120) utilized in a chip-level integration process (e.g., chip level signal, clock route, power route, etc.) where chip-level routing is performed in the chip-level routing layer (e.g., the layer 400) adjacent to the outermost core logic layer (e.g., the layer 100). The outermost core logic layer (e.g., the layer 100) may have core logic routes (e.g., the routes 106) and metal filled un-wired tracks (e.g., the set of tracks 306). The chip-level routing layer (e.g., the layer 400) may have a set of routes (e.g., a set of routes 402) for (e.g., signal, clock, power, etc. . . . )

A set of un-wired tracks (e.g., a set of tracks 404) may be metal filled to reproduce the parasitic environment 300 constructed during which the core timing model was generated. The filled metal (e.g., the set of tracks 404) in the chip-level routing layer (e.g., the layer 400) used in the outermost layer (e.g., the layer 100) of the core logic is oriented orthogonal to a preferred direction of tracks in the outermost layer of each core logic. The metal filling of the core logic and the metal filling of the chip-level routing may also be same types of metal.

As such, the chip-level routes (e.g., the set of tracks 402 and the set of tracks 404) represent a typical routing for this layer. The parasitic environment (e.g., a parasitic capacitor 206, 208, 210, 212, 214 of FIG. 2) of the core logic (e.g., the core logic 120) caused by interactions between core logic components and chip-level components (e.g., a parasitic capacitor 206, 208, 210, 212, 214 of FIG. 2) during any chip-level integration process (e.g., chip level signal routes, clock routes, power routes, and/or additional metallization, etc.) may be thus reproduced.

The core timing model generated for the core logic (e.g., the core logic 120) before the chip-level integration process (e.g., chip level signal routes, clock routes, power routes, and/or additional metallization, etc.) may be used to perform timing analysis after the chip-level integration process (e.g., chip level signal routes, clock routes, power routes, and/or additional metallization, etc.). The core timing model may be applied to generate a delay model and/or a cross-talk immune model for any hierarchical structure (e.g., placing a black box in a higher level design, etc.) independent of logic type.

Figure 5:
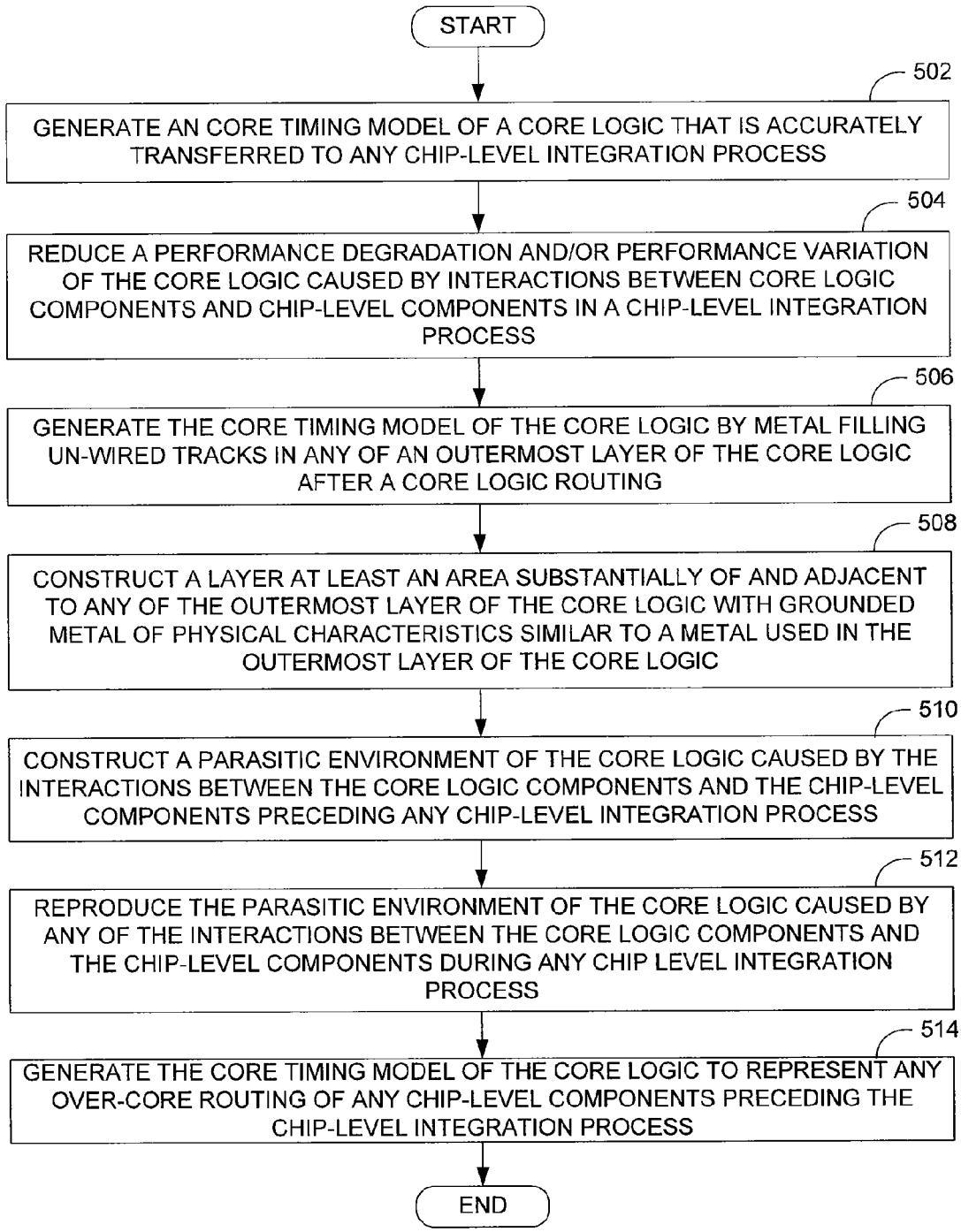
FIG. 5 is a process flow of generating a core timing model of a core logic that is accurately transferable and/or transferred to a chip-level integration process, according to one embodiment.

FIG. 5 is a process flow of generating a core timing model of a core logic that is accurately transferable (and/or transferred) to a chip-level integration process (e.g., chip level signal routes, clock routes, power routes, and/or additional metallization, etc.), according to one embodiment.

In operation 502, a core timing model of core logic (e.g., a core logic 120 of FIGS. 1-4) that is accurately transferable to any chip-level integration process (e.g., chip level signal routes, power routes, metal utilization, etc.) may be generated. In operation 504, a performance degradation and/or a performance variation of the core logic (e.g., the core logic 120 of FIGS. 1-4) caused by interactions between core logic components (e.g., a set of routes 106 of FIGS. 1-4) and chip-level components (e.g., a set of routes 216, 218 of FIG. 2) in a chip-level integration process (e.g., chip level signal routes, power routes, metal utilization, etc.).

In operation 506, the core timing model of the core logic may be generated by metal filling un-wired tracks (e.g., a set of tracks 306 of FIGS. 3-4) in an outermost layer (e.g., a layer 100) of the core logic after a core logic routing. In operation 508, a layer (e.g., a layer 302 of FIG. 3) at least an area substantially of and adjacent to an outermost layer (e.g., the layer 100 of FIGS. 1-4) of the core logic (e.g., the core logic 120 of FIGS. 1-4) with grounded metal (e.g., a set of tracks 308 of FIG. 3) of physical characteristics similar to a metal used in the outermost layer of the core logic routes may be constructed. In operation 510, a parasitic environment (e.g., parasitic capacitors 206-214 of FIG. 2) of the core logic caused by the interactions between the core logic components (e.g., the set of routes 106 of FIGS. 1-4) and the chip-level components (e.g., the set of routes 216, 218 of FIG. 2) preceding any chip-level integration process may be generated.

In operation 512, the parasitic environment of the core logic (e.g., the core logic 120 of FIG. 1) caused by any of the interactions between the core logic components (e.g., the set of routes 106 of FIGS. 1-4) and the chip-level components (e.g., the set of routes 216, 218 of FIG. 2) during any chip-level integration process (e.g., chip level signal routes, power routes, and/or metal utilization, etc.) may be reproduced. In operation 514, the core timing model of the core logic (e.g., the core logic 120 of FIG. 1) to represent any over-core routing preceding the chip-level integration process (e.g., chip level signal routes, power routes, and/or metal utilization, etc.) may be generated.

Figure 6:
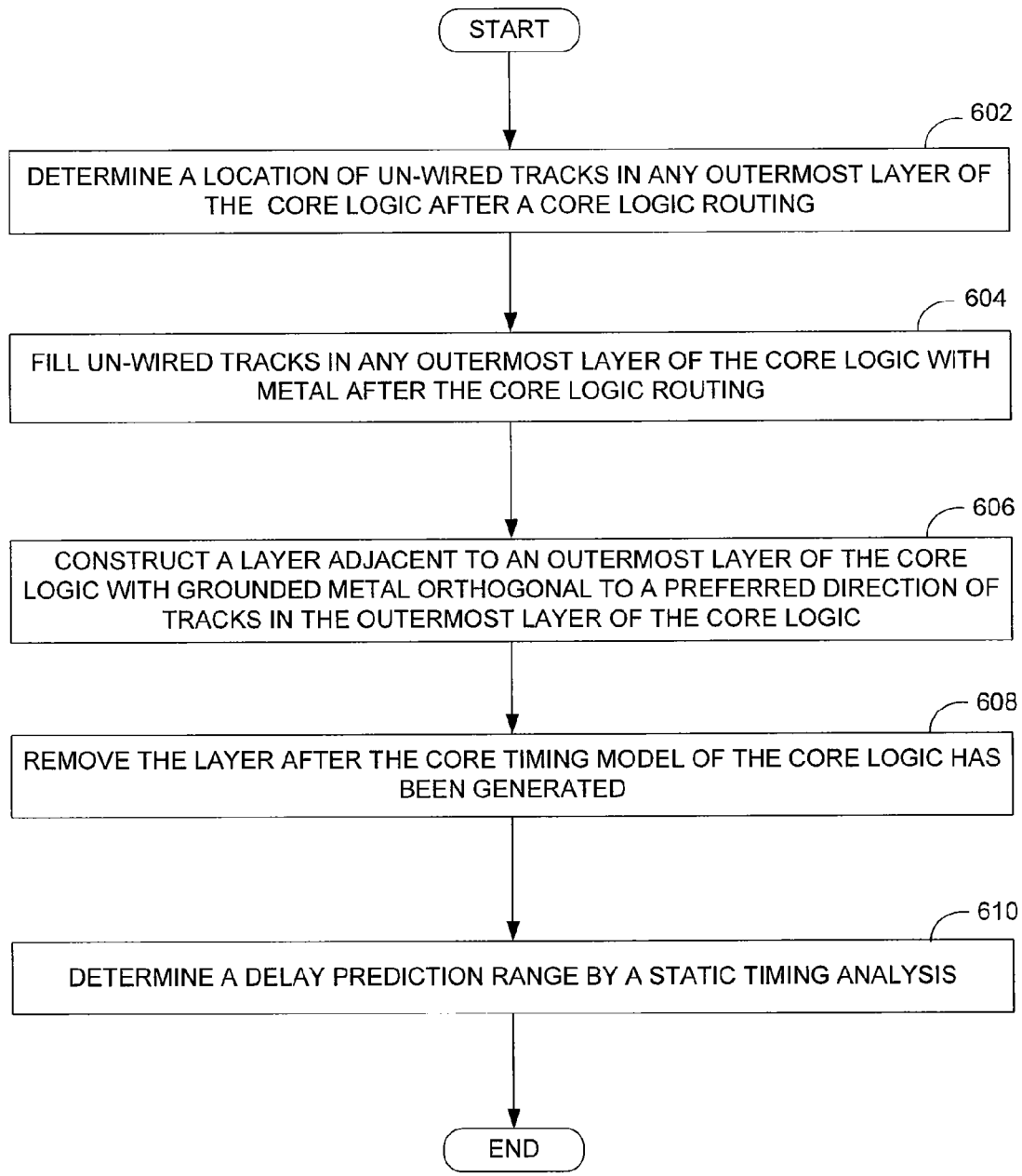
FIG. 6 is a process flow of determining a location of un-wired tracks in any outermost layer of core logic after a core logic routing, according to one embodiment.

FIG. 6 is a process flow of determining a location of un-wired tracks in any outermost layer of core logic after a core logic routing, according to one embodiment. In operation 602, a location of un-wired tracks (e.g., a set of tracks 306 of FIGS. 3-4) in any outermost layer (e.g., a layer 100 of FIGS. 1-4) of core logic (e.g., core logic 120 of FIGS. 1-4) after a core logic routing may be determined. In operation 604, the un-wired tracks (e.g., the set of tracks 306 of FIG. 3-4) in an outermost layer (e.g., the layer 100 of FIGS. 1-4) of the core logic (e.g., the core logic 120 of FIGS. 1-4) may be filled with metal after the core logic routing.

In operation 606, a layer (e.g., a layer 302 of FIG. 3) adjacent to an outermost layer (e.g., the layer 100 of FIGS. 1-4) of the core logic may be constructed with grounded metal orthogonal to a preferred direction of tracks (e.g., the set of tracks 106 of FIGS. 1-4) in the outermost layer (e.g., the layer 100 of FIGS. 1-4) of the core logic. In operation 608, the layer adjacent to the outermost layer (e.g., the layer 302 of FIG. 3) may be removed after the core timing model of the core logic has been generated. In operation 610, a delay prediction range may be determined by a static timing analysis.

Figure 7:
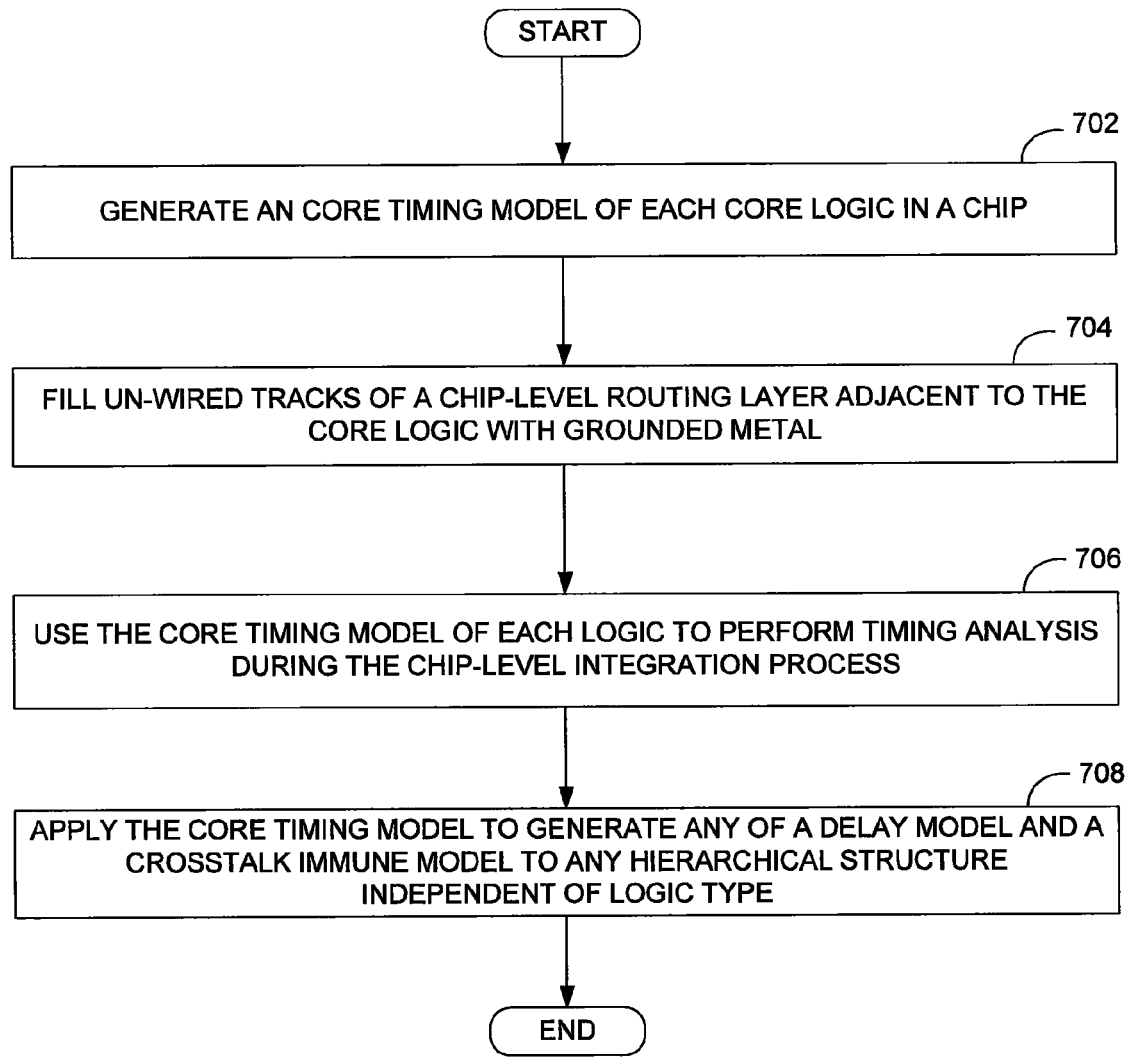
FIG. 7 is a process flow of generating a core timing model of each core logic in a chip, according to one embodiment.

FIG. 7 is a process flow of generating a core timing model of each core logic in a chip (e.g., a microchip 150A-B of FIGS. 1A-B), according to one embodiment. In operation 702, a core timing model of each core logic (e.g., the core logic 120 of FIGS. 1-4) in a chip (e.g., a microchip 150A-B of FIG. 1) maybe generated. In operation 704, un-wired tracks (e.g., a set of tracks 404 of FIG. 4G of a chip-level routing layer (e.g. a layer 400 of Figures F-G) adjacent to the core logic may be filled with grounded metal. In operation 706, the core timing model of each logic may be used to perform timing analysis (e.g., determine a path delay) during the chip-level integration process. In operation 708, the core timing model may be applied to generate a delay model and/or a cross-talk immune model to any hierarchical structure (e.g., placing a black box in a higher level design, etc.) independent of logic type.

Figure 8:
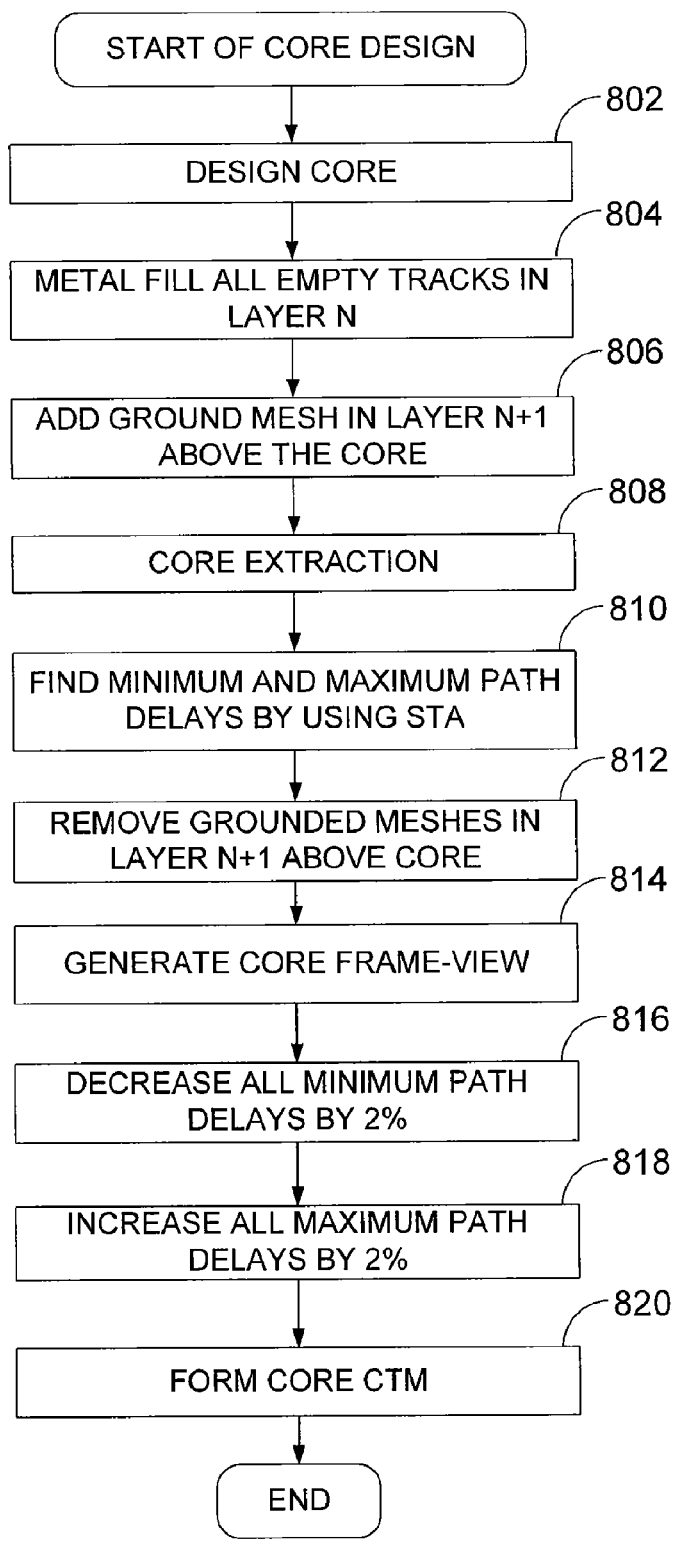
FIG. 8 is a flow chart showing a core timing model creation according to one embodiment.

FIG. 8 is a flow chart showing a core timing model creation according to one embodiment. In operation 802, the core (e.g., the core logic 120 of FIGS. 1-4) in a chip (e.g., a microchip 150A-B of FIG. 1) may be designed. In operation 804, all empty tracks in layer N (e.g., the layer 100 of FIGS. 1-4) may be filled with metal. In operation 806, in a layer N+1 (e.g., a layer 302 of FIG. 3) above the core (e.g., the core logic 120 of FIGS. 1-4) in a chip (e.g., a microchip 150A B of FIG. 1), ground mesh may be added.

In operation 808, a parasitic value in the core may be extracted. In operation 810, a minimum and maximum path delay may be found using static timing analysis. In operation 812, the grounded mesh in the layer N+1 (e.g., a layer 302 of FIG. 3) above the core (e.g., the core logic 120 of FIGS. 1-4) may be removed. In operation 814, a core frame-view may be generated. In operation 816, all minimum path delays may be decreased by some small percentage (e.g., 5%). In operation 818, all maximum path delays may be increased by some small percentage (e.g., 2%). In operation 820, the core timing model may be formed.

Figure 9:
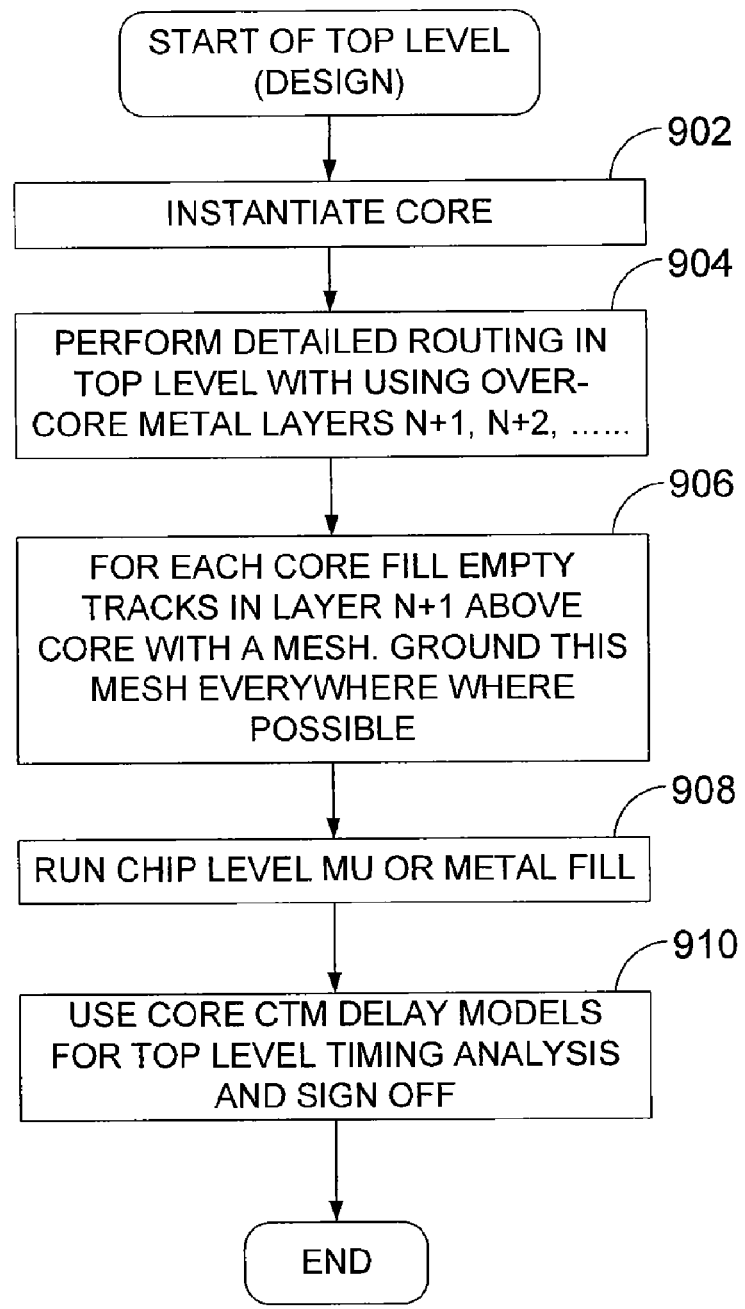
FIG. 9 is a flow chart of a chip-level integration process design flow, according to one embodiment.

FIG. 9 is a flow chart of a chip-level integration process design flow, according to one embodiment. In operation 902, a core (e.g., the core logic 120 of FIGS. 1-4) may be instantiated. In operation 904, a detailed routing in the chip level integration process (e.g., chip level signal routes, clock routes, power routes, and/or additional metallization, etc.) may be performed using over-core metal layers (e.g., layers N+1, N+2, etc.).

In operation 906, empty tracks in layer N+1 above the core (e.g., the core logic 120 of FIGS. 1-4) may be filled with grounded mesh. In operation 908, chip-level additional metal may be added. In operation 910, a core timing model may be used for top level timing analysis (e.g., determine a path delay) and sign off Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated ASIC circuitry).

In addition, it will be appreciated that the various operations, processes, and methods disclosed herein may be embodied in a machine-readable medium and/or a machine accessible medium compatible with a data processing system (e.g., a computer system), and may be performed in any order. Accordingly, the specification and drawings are to be regarded in an illustrative rather than a restrictive sense.

What is claimed is:

1. A method for generating a core timing model of a core logic through a computing system, the method comprising:
determining a location of un-wired tracks in an outermost layer of the core logic after a core logic routing;
metal filling the un-wired tracks after the core logic routing;
constructing an adjacent layer that is adjacent to the outermost layer of the core logic, the constructing of the adjacent layer including orienting a grounded metal in the adjacent layer in an orientation that is orthogonal to a direction of the un-wired tracks; and
generating at least one of a delay model and a cross-talk immune model of a hierarchical arrangement independent of any logic type through said computing system.

2. The method of claim 1, wherein the metal filling of the un-wired tracks includes filling the un-wired tracks with a metal including substantially similar physical characteristics to the grounded metal.

3. The method of claim 1, wherein the constructing of the adjacent layer includes constructing the adjacent layer including a core window that approximately occupies an area of the core logic, wherein the grounded metal resides in the core window.

4. The method of claim 1, wherein the constructing of the adjacent layer includes constructing the adjacent layer including a chip-level routing layer having a set of routes configured to provide chip-level routing.

5. The method of claim 4, wherein the set of routes of the chip-level routing layer is configured to provide at least one of chip-level signal routes, clock routes, and power routes.

6. The method of claim 4, wherein the grounded metal in the chip-level routing layer represents a similar parasitic characteristic of the core logic during generation of the core timing model.

7. The method of claim 1, further comprising:
generating the core timing model based on a parasitic capacitance due to an interaction between the outermost layer of the core logic and the adjacent layer.

8. The method of claim 7, further comprising:
removing the adjacent layer after the core timing model of the core logic has been generated.

9. The method of claim 1, wherein the generating of the core timing model includes utilizing a static timing analysis tool.

10. The method of claim 1, including utilizing the core timing model to decrease a minimum delay value of a delay model prediction range by 5% and to increase a maximum delay value of the delay model prediction range by 2% to account for grounding gaps and other non-idealities.

11. An integrated circuit representation on a computer system comprising:
a microchip substrate;
a core logic layer including an outermost core logic layer having a set of un-wired tracks that are metal filled based on determining a location of the set of un-wired tracks; and
a chip-level routing layer adjacent to the outermost chip-level routing layer, the chip-level routing layer including another set of un-wired tracks that are metal filled, and the chip-level routing layer being constructed through orienting a grounded metal in an orientation that is orthogonal to a direction of the un-wired tracks,
wherein at least one of a delay model and a cross-talk immune model of a hierarchical arrangement of a high-level representation of the integrated chip is configured to be generated through the computing system independent of any logic type.

12. The integrated circuit representation of claim 11, wherein a first metal filling of the set of un-wired tracks is typical for the core logic layer and a second metal filling of the other set of un-wired tracks is typical for the chip-level routing layer.

13. The integrated circuit representation of claim 12, wherein the first metal filling of the set of un-wired tracks and the second metal filling of the other set of un-wired tracks include a same metal.

14. The integrated circuit representation of claim 12, wherein the chip-level routing layer includes a core window, and wherein the second metal filling of the chip-level routing layer resides in the core window.

15. The integrated circuit representation of claim 14, wherein the core window of the chip-level routing layer spatially occupies, at least substantially, an area of the core logic.

16. The integrated circuit representation of claim 11, wherein a core timing model for the core logic layer that is generated through the computing system based on the metal filled set of un-wired tracks of the core logic layer, and the metal filled other set of un-wired tracks of the chip-level routing layer, represents an over-core routing in the chip-level routing layer.

17. The integrated circuit representation of claim 16, wherein the core timing model is configured to be used in over-core routing of a plurality of different chip-level arrangements.

18. The integrated circuit representation of claim 11, wherein the chip-level routing layer includes a set of routes configured to provide at least one of signal routes, clock routes and power routes.

* * * * *